US 11,641,191 B2

(12) United States Patent
Conte et al.

(10) Patent No.: US 11,641,191 B2
(45) Date of Patent: May 2, 2023

(54) RING OSCILLATOR CIRCUIT

(71) Applicants: STMicroelectronics S.r.l., Agrate Brianza (IT); STMicroelectronics (Alps) SAS, Grenoble (FR)

(72) Inventors: Antonino Conte, Tremestieri Etneo (IT); Marco Ruta, San Gregorio di Catania (IT); Michelangelo Pisasale, Catania (IT); Thomas Jouanneau, ST-Egreve (FR)

(73) Assignees: STMICROELECTRONICS S.R.L., Agrate Brianza (IT); STMICROELECTRONICS (ALPS) SAS, Grenoble (FR)

( * ) Notice: Subject to any disclaimer, the term of this patent is extended or adjusted under 35 U.S.C. 154(b) by 0 days.

(21) Appl. No.: 17/830,864

(22) Filed: Jun. 2, 2022

(65) Prior Publication Data

US 2022/0399880 A1    Dec. 15, 2022

(30) Foreign Application Priority Data

Jun. 15, 2021  (IT) .......................... 102021000015647

(51) Int. Cl.
*H03K 3/03*       (2006.01)
*H03K 3/011*     (2006.01)
(Continued)

(52) U.S. Cl.
CPC ........... *H03K 3/0315* (2013.01); *H03K 3/011* (2013.01); *H03K 3/012* (2013.01); *H03K 3/014* (2013.01)

(58) Field of Classification Search
CPC ........ H03K 3/011; H03K 3/012; H03K 3/014; H03K 3/0315; H03K 3/0322
(Continued)

(56) References Cited

U.S. PATENT DOCUMENTS

| 4,592,087 A | 5/1986 | Killion |
| 5,446,418 A | 8/1995 | Hara et al. |

(Continued)

OTHER PUBLICATIONS

Huo, Changxing, et al., "A 400MHz Current Starved Ring Oscillator With Temperature and Supply Voltage Insensitivity", 2014 12th IEEE International Conference on Solid-State and Integrated Circuit Technology (ICSICT), Guilin, China, Oct. 28-31, 2014, 3 pages.

*Primary Examiner* — Levi Gannon
(74) *Attorney, Agent, or Firm* — Slater Matsil, LLP

(57) ABSTRACT

In an embodiment a ring oscillator circuit includes a chain of cascade-coupled inverter stages coupled between an oscillator supply voltage node and a reference voltage node, the oscillator supply voltage node configured to provide an oscillator supply voltage, a current generator circuit coupled between the oscillator supply voltage node and a system supply voltage node configured to provide a system supply voltage, the current generator circuit being configured to inject a current into the oscillator supply voltage node and a biasing circuit including a first bias control transistor and a second bias control transistor coupled in series between the reference voltage node and the oscillator supply voltage node, wherein the first bias control transistor is configured to selectively couple the reference voltage node and the oscillator supply voltage node in response to the oscillator control signal being indicative that the ring oscillator circuit is in an inactive operation state.

16 Claims, 5 Drawing Sheets

(51) Int. Cl.
*H03K 3/014* (2006.01)
*H03K 3/012* (2006.01)

(58) Field of Classification Search
USPC .......................................................... 331/57
See application file for complete search history.

(56) References Cited

U.S. PATENT DOCUMENTS

| | | | |
|---|---|---|---|
| 6,154,100 A | 11/2000 | Okamoto | |
| 7,330,081 B1 * | 2/2008 | Asa ...................... | H03K 3/0315 |
| | | | 331/186 |
| 2015/0048809 A1 * | 2/2015 | Teraguchi ............. | H02M 3/073 |
| | | | 323/271 |

* cited by examiner

RING OSCILLATOR CIRCUIT

CROSS-REFERENCE TO RELATED APPLICATIONS

This application claims the benefit of Italian Patent Application No. 102021000015647, filed on Jun. 15, 2021, which application is hereby incorporated herein by reference.

TECHNICAL FIELD

The description relates to oscillator circuits, in particular to ring oscillator circuits.

BACKGROUND

Ring oscillators are used in electronics in a wide range of applications. Ring oscillators may be used in digital circuits, for instance, to produce an internal clock reference signal (e.g., for a state machine or a central processing unit, CPU). Ring oscillators may also be used in analog circuits, for instance, to produce a time base (e.g., for a switched capacitor filter, a charge pump circuit, a sample-and-hold circuit, and the like).

Current starved ring oscillators are conventional ring oscillators that include a current limiter to control power consumption.

Amongst the advantages of current starved ring oscillators are high speed and/or low power consumption. Additionally, temperature compensation may be achieved in current starved ring oscillators by means of proper sizing, considering a single (e.g., fixed) oscillation frequency.

On the other hand, the drawbacks of current starved ring oscillators may include start/stop transients with uncontrolled frequency. Additionally, conventional current starved ring oscillators may be hard to tune (e.g., compensate) versus temperature for multiple oscillation frequencies.

Therefore, there is a need in the art to provide improved current starved ring oscillators that are easy to tune versus temperature. In particular, it may be desirable to provide improved current starved ring oscillators that are easy to tune versus temperature at different oscillation frequencies. Additionally, it may be desirable to provide improved current starved ring oscillators that can provide fast start/stop operation (e.g., with a reduced or virtually absent start/stop transient phase).

SUMMARY

Various embodiments provide ring oscillators. Various other embodiments provide an improved current starved ring oscillator.

In one or more embodiments, a ring oscillator may comprise a chain of cascade-coupled inverter stages coupled between an oscillator supply voltage node and a reference voltage node. The oscillator supply voltage node may be configured to provide an oscillator supply voltage. The ring oscillator may comprise a current generator circuit coupled between the oscillator supply voltage node and a system supply voltage node configured to provide a system supply voltage. The current generator circuit may be configured to inject a current into the oscillator supply voltage node. Each inverter stage may comprise a first low-side transistor and a second low-side transistor coupled in series between the reference voltage node and an output node of the respective inverter stage, and a first high-side transistor coupled between the oscillator supply voltage node and the output node of the respective inverter stage. The first low-side transistor and the first high-side transistor may have respective control terminals coupled to an input node of the respective inverter stage to receive therefrom a respective inverter control signal. The second low-side transistor may have a control terminal coupled to the oscillator supply voltage node to receive the oscillator supply voltage. The ring oscillator may further comprise a biasing circuit including a first bias control transistor and a second bias control transistor coupled in series between the reference voltage node and the oscillator supply voltage node. The first bias control transistor may have a control terminal configured to receive an oscillator control signal indicative of whether the ring oscillator circuit is in an active operation state or in an inactive operation state, and the second bias control transistor may have a control terminal coupled to the oscillator supply voltage node to receive the oscillator supply voltage. The first bias control transistor may be configured to selectively couple the reference voltage node and the oscillator supply voltage node in response to the oscillator control signal being indicative of the ring oscillator circuit being in an inactive operation state.

One or more embodiments may thus facilitate temperature compensation as well as fast start/stop operation of the ring oscillator, resulting in a reduced or virtually absent start/stop transient phase.

In one or more embodiments, the conductivity of the first low-side transistors operating in a conductive state may be higher than the conductivity of the respective second low-side transistors operating in a conductive state.

In one or more embodiments, a conductive channel of the first low-side transistors may be shorter than a conductive channel of the respective second low-side transistors.

In one or more embodiments, each inverter stage may comprise a second high-side transistor coupled in series to the first high-side transistor between the oscillator supply voltage node and the output node of the respective inverter stage. The second high-side transistor may have a control terminal coupled to the reference voltage node.

In one or more embodiments, the second high-side transistor of a last inverter stage in the chain of cascade-coupled inverter stages may have a control terminal configured to receive the oscillator control signal.

In one or more embodiments, the conductivity of the first high-side transistors and/or the second high-side transistors operating in a conductive state may be higher than the conductivity of the respective first low-side transistors operating in a conductive state and higher than the conductivity of the respective second low-side transistors operating in a conductive state.

In one or more embodiments, a conductive channel of the first high-side transistors and/or the second high-side transistors may be shorter than a conductive channel of the respective first low-side transistors and shorter than a conductive channel of the respective second low-side transistors.

In one or more embodiments, a ring oscillator circuit may comprise an output control transistor coupled between an output node of the ring oscillator circuit and the reference voltage node. The output control transistor may have a control terminal configured to receive the oscillator control signal, and may be configured to selectively couple the reference voltage node and the output node of the ring oscillator circuit in response to the oscillator control signal being indicative of the ring oscillator circuit being in an inactive operation state.

In one or more embodiments, each inverter stage may comprise a plurality of second low-side transistors arranged in parallel. The second low-side transistors arranged in parallel may have different conductivity values when operating in a conductive state. The second low-side transistors arranged in parallel may have respective control terminals selectively couplable to the oscillator supply voltage node as a function of respective frequency selection signals. The biasing circuit may include a plurality of second bias control transistors arranged in parallel. The second bias control transistors arranged in parallel may have different conductivity values when operating in a conductive state. The second bias control transistors arranged in parallel may have respective control terminals selectively couplable to the oscillator supply voltage node as a function of the respective frequency selection signals.

BRIEF DESCRIPTION OF THE DRAWINGS

One or more embodiments will now be described, by way of example only, with reference to the annexed figures.

DETAILED DESCRIPTION OF ILLUSTRATIVE EMBODIMENTS

In the ensuing description, one or more specific details are illustrated, aimed at providing an in-depth understanding of examples of embodiments of this description. The embodiments may be obtained without one or more of the specific details, or with other methods, components, materials, etc. In other cases, known structures, materials, or operations are not illustrated or described in detail so that certain aspects of embodiments will not be obscured.

Reference to "an embodiment" or "one embodiment" in the framework of the present description is intended to indicate that a particular configuration, structure, or characteristic described in relation to the embodiment is comprised in at least one embodiment. Hence, phrases such as "in an embodiment" or "in one embodiment" that may be present in one or more points of the present description do not necessarily refer to one and the same embodiment. More-over, particular configurations, structures, or characteristics may be combined in any adequate way in one or more embodiments.

The headings/references used herein are provided merely for convenience and hence do not define the extent of protection or the scope of the embodiments.

Throughout the figures annexed herein, unless the context indicates otherwise, like parts or elements are indicated with like references/numerals and a corresponding description will not be repeated for the sake of brevity.

Figure 1:
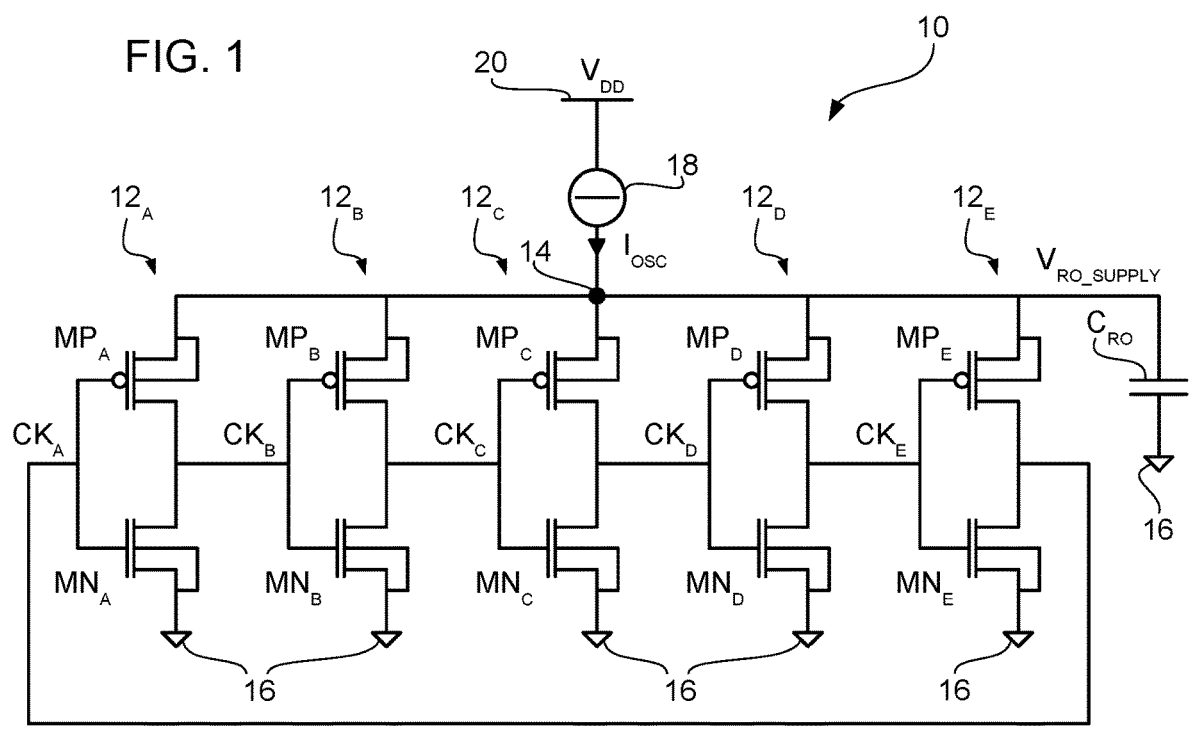
FIG. 1 is a circuit diagram exemplary of a ring oscillator.

By way of introduction to the detailed description of exemplary embodiments, reference may first be made to FIG. 1, which is a circuit diagram exemplary of a current starved ring oscillator 10 (also referred to simply as ring oscillator in the present description, for the sake of brevity only).

A ring oscillator 10 comprises a chain of inverter stages 12, e.g., five inverter stages $12_A$, $12_B$, $12_C$, $12_D$, $12_E$ as exemplified in FIG. 1. Each inverter stage 12 comprises an input node and an output node, with the output node of each inverter stage in the chain coupled to the input node of a subsequent inverter stage in the chain. The output node of the last inverter stage of the chain (e.g., $12_E$) is coupled to the input node of the first inverter stage of the chain (e.g., $12_A$). The input (clock) signals CK received at the input nodes of the inverter stages are respectively designated herein as $CK_A$, $CK_B$, $CK_C$, $CK_D$, $CK_E$. As exemplified in FIG. 1, each inverter stage is coupled between an oscillator supply voltage node 14 and a common reference voltage node 16. The oscillator supply voltage node 14 may provide a common oscillator supply voltage $V_{RO\_SUPPLY}$, and the reference voltage node 16 may provide a common reference voltage $V_{GND}$ (e.g., 0 V). Each inverter stage 12 may comprise a respective n-channel MOS transistor MN (e.g., $MN_A$, $MN_B$, $MN_C$, $MN_D$, $MN_E$) having a source terminal coupled to the reference voltage node 16 and a drain terminal coupled to the output node of the respective inverter stage, and a respective p-channel MOS transistor MP (e.g., $MP_A$, $MP_B$, $MP_C$, $MP_D$, $MP_E$) having a source terminal coupled to the oscillator supply voltage node 14 and a drain terminal coupled to the output node of the respective inverter stage. The gate terminals of the n-channel MOS transistors MN and of the p-channel MOS transistors MP may be coupled to the input nodes of the respective inverter stages. All the transistors MN may have their bulk terminal connected to the reference voltage node 16, and all the transistors MP may have their bulk terminal connected to the oscillator supply voltage node 14.

A capacitance $C_{RO}$ may be coupled between the oscillator supply voltage node 14 and the common reference voltage node 16. The person skilled in the art will understand that the capacitance $C_{RO}$ can be either an intrinsic capacitance at node 14 or an external capacitance added on purpose to increase the capacitance value at node 14, so as to improve the stability of the oscillator supply voltage $V_{RO\_SUPPLY}$. In one or more embodiments, the capacitance $C_{RO}$ may be an external capacitor whose capacitance adds up to the intrinsic one.

The ring oscillator 10 may comprise a current generator 18 coupled between the oscillator supply voltage node 14 and a further supply voltage node 20 (e.g., a system supply voltage node) that provides a system supply voltage $V_{DD}$, e.g., higher than the oscillator supply voltage $V_{RO\_SUPPLY}$. The current generator 18 may force a current $I_{OSC}$ to flow (e.g., may inject a current $I_{OSC}$) into the oscillator supply voltage node 14, thereby controlling (e.g., limiting) the value of the oscillator current $I_{OSC}$. The oscillation swing (e.g., the maximum signal amplitude at the output node of the last inverter stage $12_E$) is limited to the oscillator supply voltage $V_{RO\_SUPPLY}$ at node 14. The voltage level $V_{RO\_SUPPLY}$ in turn depends on the value of the current $I_{OSC}$ and on the sizing of the inverter stages 12.

In a ring oscillator 10 as exemplified in FIG. 1, the oscillation frequency depends on the voltage $V_{RO\_SUPPLY}$ at node 14 and on the capacitive load at the output node of each inverter stage 12. The global oscillation period $T_{OSC}$ is equal to n times the propagation delay $T_D$ of each inverter stage (i.e., $T_{OSC}=n*T_D$), n being the number of chained inverter stages 12 (e.g., in the case exemplified herein where the ring oscillator 10 comprises five inverter stages, $T_{OSC}=5*T_D$). In a simplified model, the propagation delay $T_D$ of each inverter stage 12 is equal to the sum of two components, i.e., the rising edge time $T_{RE}$ and the falling edge time $T_{FE}$: $T_D=T_{RE}+T_{FE}$.

In a conventional current starved ring oscillator, providing satisfactory temperature compensation may rely on finding the correct tuning between different variables, leading to an unclear design procedure. For instance, given the oscillation frequency $F_{OSC}$, the minimum system supply voltage $V_{DD,min}$ (at node 20) and the power consumption level as target specifications, the available design parameters may include the value of the current $I_{OSC}$ and/or the buffer sizing (e.g., sizing of the inverter stages 12).

Additionally, in a conventional current starved ring oscillator, (dynamic) tuning of the oscillation frequency $F_{OSC}$ (e.g., to provide oscillation at multiple frequencies) may rely on varying the value of the current $I_{OSC}$, thereby affecting the accuracy of the temperature compensation, which is usually obtained for a single working point (i.e., temperature compensation may be effective only for a single value of the oscillator current $I_{OSC}$).

Additionally, operation of a conventional current starved ring oscillator may include a start transient during which the oscillator operates at a frequency (initial frequency) not corresponding to the target frequency. In some applications, fast oscillator start/stop operation may be desirable (e.g., for use in charge pump circuits, or to generate timing phases for reading circuitry in a memory, and the like). A stabilization period can be requested after a stop or at start up to restart the oscillation. The oscillator can be started periodically (e.g., to refresh internal voltages such as the oscillator supply voltage $V_{RO\_SUPPLY}$), but an additional oscillator may be required (e.g., a low consumption oscillator).

Operation of a ring oscillator 10 as exemplified in FIG. 1 may be further understood with reference to FIGS. 2, 3 and 4 discussed below.

Figure 2:
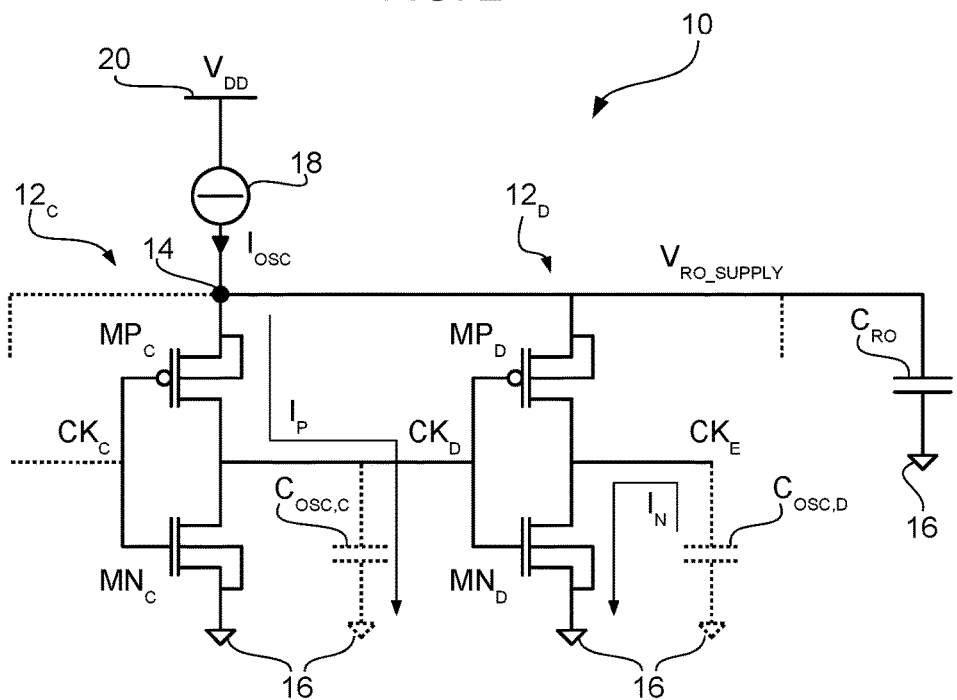
FIG. 2 is a circuit diagram exemplary of a portion of a ring oscillator.

FIG. 2 is a circuit diagram exemplary of a portion of the ring oscillator 10, illustrating in particular the inverter stages $12_C$, $12_D$ and the respective input signal $CK_C$, intermediate signal $CK_D$, and output signal $CK_E$. Additionally, FIG. 2 illustrates the capacitances $C_{OSC,C}$ and $C_{OSC,D}$ (e.g., intrinsic capacitances) at the output nodes of the inverter stages $12_C$ and $12_D$, which affect the propagation delay $T_D$ of the inverter stages. It will be understood that FIG. 2 refers to a portion of the ring oscillator 10 by way of example, and that similar operation may take place in other portions of the ring oscillator 10.

Figure 3:
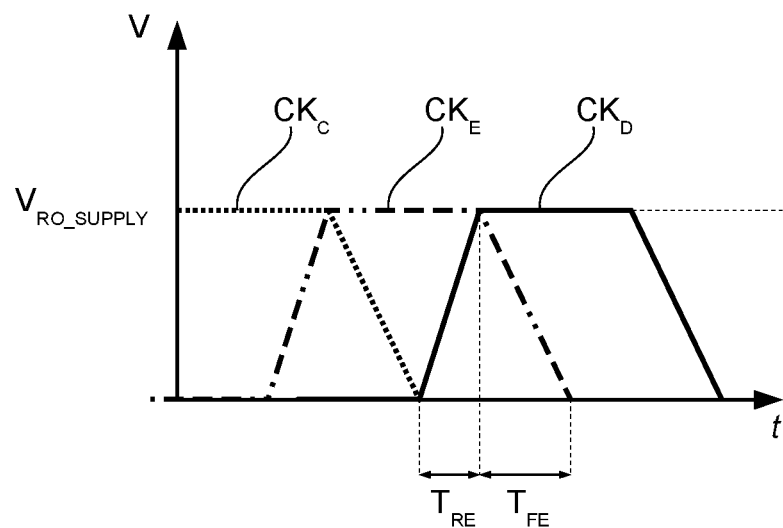
FIG. 3 is a diagram exemplary of possible time behavior of signals in a balanced ring oscillator.

FIG. 3 is a diagram exemplary of possible time behavior of signals $CK_C$ (dotted line), $CK_D$ (solid line) and $CK_E$ (dash-and-dot line) in the ring oscillator 10 exemplified in FIG. 2, according to a first example where the p-channel MOS transistors MP and the n-channel MOS transistors MN in the inverter stages 12 are balanced (e.g., they have similar conductivity in the ON state).

During each of the (e.g., five) time slots $T_D=T_{RE}+T_{FE}$, the amount of current sunk from the oscillator supply voltage node 14 is equal to $I_{OSC}$, insofar as a current $I_{OSC}$ is forced to flow into node 14 by the current generator 18. Such a condition provides an equilibrium point in the oscillator supply voltage node 14, with the oscillator supply voltage $V_{RO\_SUPPLY}$ comprised between the reference voltage of node 16 (e.g., 0 V) and the system supply voltage $V_{DD}$ (e.g., $0\ V<V_{RO\_SUPPLY}<V_{DD}$). In such a case, the current driven by each p-channel MOS transistor MP can be computed as $I_P=C_{OSC}*V_{RO\_SUPPLY}/T_{RE}$.

The average current sunk from the oscillator supply voltage node 14 during each "commutation interval" $T_D$ can thus be computed as $I_P*T_{RE}/T_D=I_{OSC}$.

Therefore, as a result of an increase of the current $I_P$, the rising edge time $T_{RE}$ decreases provided that the commutation interval $T_D$ remains the same; so, the falling edge time $T_{FE}$ increases.

Figure 4:
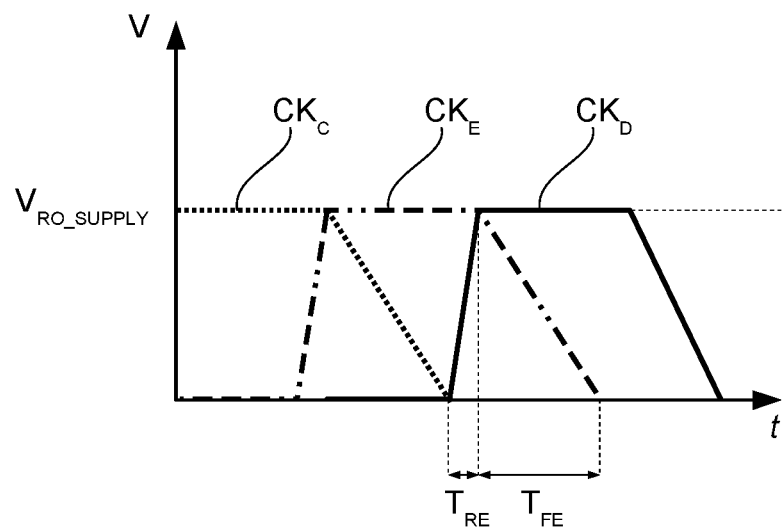
FIG. 4 is a diagram exemplary of possible time behavior of signals in an unbalanced ring oscillator.

FIG. 4 is a diagram exemplary of possible time behavior of signals $CK_C$ (dotted line), $CK_D$ (solid line) and $CK_E$ (dash-and-dot line) in the ring oscillator 10 exemplified in FIG. 2, according to a second example where the p-channel MOS transistors MP and the n-channel MOS transistors MN in the inverter stages 12 are unbalanced. In particular, FIG. 4 is exemplary of a case where the p-channel MOS transistors MP are (much) faster than the re-channel MOS transistors MN.

In the case exemplified in FIG. 4, the rising edge time $T_{RE}$ may amount to a short portion of the (overall) commutation interval $T_D$. Such a condition can be approximated as if at least one n-channel MOS transistor is always conductive (i.e., in an ON state) in any phase of the oscillation. Given the above approximation, the n-channel MOS transistor should be polarized during the discharge phase to sink a current $I_N$ equal to the current $I_{OSC}$ forced to flow into the oscillator supply voltage node 14, according to the following equations:

$$I_N*T_{FE}/T_D=I_{OSC} \rightarrow I_N \approx I_{OSC}\ \text{if}\ T_{RE} \ll T_{FE}$$

Therefore, unbalanced sizing of the p-channel MOS transistors and the n-channel MOS transistors of the inverter stages 12 (e.g., with the p-channel MOS transistors being much more conductive than the n-channel MOS transistors) may have one or more of the following implications:

with $V_{RO\_SUPPLY}>0$ the n-channel MOS transistors sink a constant current $I_N$ equal to $I_{OSC}$ during the conductive (e.g., ON) phase;

as a result of a short rising edge time $T_{RE}$, the n-channel MOS transistors have their gate terminals biased to the oscillator supply voltage $V_{RO\_SUPPLY}$ during the respective falling edge time slot $T_{FE}$ (e.g., constantly biased to $V_{RO\_SUPPLY}$);

the oscillator supply voltage $V_{RO\_SUPPLY}$ should be equal to the gate-source voltage $V_{GS}$ needed to force through the n-channel MOS transistors the current $I_{OSC}$ (e.g., on the drain terminal);

as a result of the size of the n-channel MOS transistors being such that the transistors operate at their null point at a current level $I_N \approx I_{OSC}$, the oscillator supply voltage $V_{RO\_SUPPLY}$ at node 14 may be compensated with respect to temperature variations.

In the context of the present description, the definition of "null point biasing" is based on the recognition that, for any n-channel MOS transistor, it is possible to define, as a function of the transistor size (e.g., width-to-length ratio W/L), a value of the drain current ($I_D$) where the gate-source voltage $V_{GS}$ is constant with respect to temperature. In such a biasing point, the temperature derivatives of the threshold voltage ($V_{TH}$) of the n-channel MOS transistor and the overdrive voltage ($V_{OD}=V_{GS}-V_{TH}$) of the n-channel MOS transistor compensate each other so as to maintain constant the drain current, provided that the n-channel MOS transistor operates in saturation.

Therefore, in one or more embodiments, the p-channel MOS transistors being (much) faster than the n-channel MOS transistors, and the n-channel MOS transistors being biased at null point versus current $I_{OSC}$ may result in the oscillator supply voltage $V_{RO\_SUPPLY}$ at node 14 being constant with respect to temperature variations (null point voltage of the n-channel MOS transistors), so that the oscillation will be constant with respect to temperature variations due to a constant oscillator supply voltage $V_{RO\_SUPPLY}$ and a constant oscillator current $I_{OSC}$, as per the equations below:

$$V_{RO\_SUPPLY} \sim V_{thn} + \sqrt[2]{\frac{I_{OSC} \cdot 2}{\mu_n \cdot C_{ox}} \cdot \frac{L}{W}} \sim \text{Constant at Null Point}$$

$$T_{OSC} \sim N \cdot \frac{C_{OSC} \cdot V_{RO\_SUPPLY}}{I_{OSC}}$$

Figure 5:
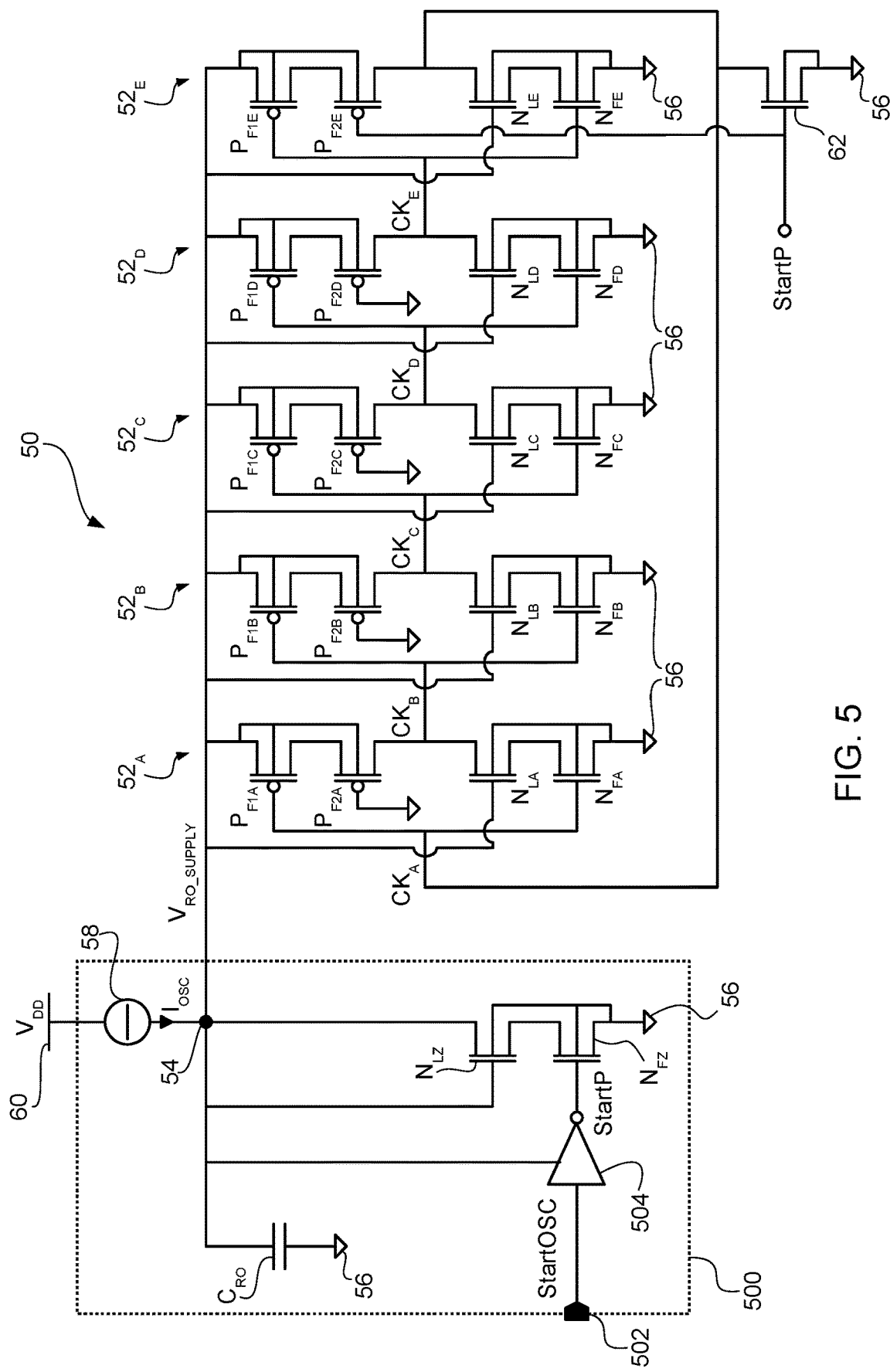
FIG. 5 is a circuit diagram exemplary of a ring oscillator according to one or more embodiments of the present description.

Therefore, one or more embodiments may relate to a current starved ring oscillator 50 as exemplified in FIG. 5.

A ring oscillator 50 comprises a chain of inverter stages 52, e.g., five inverter stages 52$_A$, 52$_B$, 52$_C$, 52$_D$, 52$_E$ as exemplified in FIG. 5. Each inverter stage 52 comprises an input node and an output node, with the output node of each inverter stage in the chain coupled to the input node of a subsequent inverter stage in the chain. The output node of the last inverter stage of the chain (e.g., 52$_E$) is coupled to the input node of the first inverter stage of the chain (e.g., 52$_A$). The input (clock) signals CK received at the input nodes of the inverter stages are respectively designated herein as CK$_A$, CK$_B$, CK$_C$, CK$_D$, CK$_E$. As exemplified in FIG. 5, each inverter stage is coupled between an oscillator supply voltage node 54 and a common reference voltage node 56. The oscillator supply voltage node 54 may provide a common oscillator supply voltage $V_{RO\_SUPPLY}$, and the reference voltage node 56 may provide a common reference voltage $V_{GND}$ (e.g., 0 V).

Each inverter stage 52 may comprise two n-channel MOS transistors N$_L$ (e.g., N$_{LA}$, N$_{LB}$, N$_{LC}$, N$_{LD}$, N$_{LE}$) and N$_F$ (e.g., N$_{FA}$, N$_{FB}$, N$_{FC}$, N$_{FD}$, N$_{FE}$) arranged in series between the reference voltage node 56 and the output node of the inverter stage. For instance, transistors N$_F$ may have their source terminals coupled to the reference voltage node 56 and their drain terminals coupled to the source terminals of the respective transistors N$_L$. Transistors N$_L$ may have their drain terminals coupled to the output nodes of the respective inverter stages. All the transistors N$_L$ and N$_F$ may have their bulk terminals connected to the reference voltage node 56. The gate terminals of the transistors N$_F$ may be coupled to the input nodes of the respective inverter stages. The gate terminals of the transistors N$_L$ may be coupled to the oscillator supply voltage node 54 to receive the oscillator supply voltage $V_{RO\_SUPPLY}$.

Each inverter stage 52 may comprise a p-channel MOS transistor P$_{F1}$ (e.g., P$_{F1A}$, P$_{F1B}$, P$_{F1C}$, P$_{F1D}$, P$_{F1E}$) having a source terminal coupled to the oscillator supply voltage node 54 and a drain terminal coupled to the output node of the inverter stage. All the transistors P$_{F1}$ may have their bulk terminals connected to the oscillator supply voltage node 54. The gate terminals of the transistors P$_{F1}$ may be coupled to the input nodes of the respective inverter stages.

Optionally, each inverter stage 52 may comprise a further p-channel MOS transistor P$_{F2}$ (e.g., P$_{F2A}$, P$_{F2B}$, P$_{F2C}$, P$_{F2D}$, P$_{F2E}$) arranged in series with the respective transistor P$_{F1}$. For instance, transistors P$_{F1}$ may have their source terminals coupled to the oscillator supply voltage node 54 and their drain terminals coupled to the source terminals of the respective transistors P$_{F2}$. Transistors P$_{F2}$ may have their drain terminals coupled to the output nodes of the respective inverter stages. All the transistors P$_{F2}$ may have their bulk terminals connected to the oscillator supply voltage node 54. The gate terminals of the transistors P$_{F2}$ may be coupled to the reference voltage node 56 to receive the reference voltage $V_{GND}$ (e.g., 0 V). Optionally, the gate terminal of the further transistor P$_{F2}$ of the last inverter stage of the inverter chain (e.g., transistor P$_{F2E}$ in the example of FIG. 5) may be configured to receive a control signal StartP generated as discussed in the following.

In one or more embodiments, transistors N$_L$ and N$_F$ may have different dimensions, insofar as they are designed to play a different role in the switching activity of the inverter stages 52. In particular, the channels of transistors N$_L$ may have a width W$_N$ and a length L$_L$. The channels of transistors N$_F$ may have the same width W$_N$ and a different (e.g., shorter) length L$_S$. Therefore, the low-side current flow line of each inverter stage 52 may comprise two n-channel MOS transistors, with a first resistive transistor N$_L$ not oscillating and having a gate terminal biased constantly at $V_{RO\_SUPPLY}$, and a second highly conductive transistor N$_F$ oscillating as driven by the respective signal CK. The second transistor N$_F$ may be designed to have a low load for oscillation, thereby facilitating oscillation at a high frequency.

In one or more embodiments, transistors P$_{F1}$ and P$_{F2}$ may have the same dimensions, insofar as they are designed to play a similar role in the switching activity of the inverter stages 52. In particular, the channels of transistors P$_{F1}$ may have a width W$_P$ and a length L$_{min}$. The channels of transistors P$_{F2}$ may have the same width W$_P$ and the same length L$_{min}$.

In one or more embodiments, the p-channel MOS transistors P$_{F1}$ and P$_{F2}$ may be designed to be (much) more conductive than the n-channel MOS transistors N$_L$ and N$_F$ when operated in the ON state, e.g., by selecting the length L$_{min}$ to be (much) shorter than the lengths L$_L$ and L$_S$. Therefore, the ring oscillator 50 may be substantially unbalanced.

In one or more embodiments as exemplified in FIG. 5, a ring oscillator 50 may comprise a biasing circuit 500. The basing circuit 500 may comprise a current generator 58 coupled between the oscillator supply voltage node 54 and a further supply voltage node 60 (e.g., a system supply voltage node) providing a system supply voltage $V_{DD}$, e.g., higher than the oscillator supply voltage $V_{RO\_SUPPLY}$. The current generator 58 may force a current $I_{OSC}$ to flow into the oscillator supply voltage node 54 by (e.g., the current generator 58 may inject a current $I_{OSC}$ into node 54).

The biasing circuit 500 may comprise an input terminal 502 configured to receive a control signal StartOsc. The control signal StartOsc may be asserted (e.g., set to 1) when the ring oscillator is expected to produce an oscillating output voltage, and may be de-asserted (e.g., set to 0) when the ring oscillator is not expected to produce an oscillating output voltage. The biasing circuit 500 may comprise an inverter circuit 504 configured to receive the control signal StartOsc and to produce an output signal StartP that substantially corresponds to an inverted replica of the control signal StartOsc. The biasing circuit 500 may comprise two n-channel MOS transistors $N_{LZ}$ and $N_{FZ}$ arranged in series between the reference voltage node 56 and the oscillator supply voltage node 54. For instance, transistor $N_{FZ}$ may have a source terminal coupled to the reference voltage node 56 and a drain terminal coupled to the source terminal of transistor $N_{LZ}$. Transistor $N_{LZ}$ may have a drain terminal coupled to the oscillator supply voltage node 54. Transistors $N_{LZ}$ and $N_{FZ}$ may have their bulk terminals connected to the reference voltage node 56. The gate terminal of transistor $N_{FZ}$ may be coupled to the output of the inverter circuit 504 to receive the control signal StartP. The gate terminal of transistor $N_{LZ}$ may be coupled to the oscillator supply voltage node 54 to receive the oscillator supply voltage $V_{RO\_SUPPLY}$. Transistors $N_{LZ}$ and $N_{FZ}$ may be sized substantially as the pairs of transistors $N_L$ and $N_F$ in the inverter stages 52. In particular, the channel of transistor $N_{LZ}$ may have a width $W_N$ and a length $L_L$. The channel of transistor $N_{FZ}$ may have the same width $W_N$ and a different length $L_S$.

The biasing circuit 500 may comprise a capacitance $C_{RO}$ coupled between the oscillator supply voltage node 54 and the common reference voltage node 56. As previously discussed, the capacitance $C_{RO}$ can be either an intrinsic capacitance at node 54 or an external capacitance added on purpose to increase the capacitance value at node 54, so as to improve the stability of the oscillator supply voltage $V_{RO\_SUPPLY}$. In one or more embodiments, the capacitance $C_{RO}$ may be an external capacitor whose capacitance adds up to the intrinsic one.

In one or more embodiments, a ring oscillator 50 may further comprise an n-channel MOS transistor 62 having a selectively conductive channel arranged between the output node of the ring oscillator 50 (e.g., the output terminal of the last inverter stage, exemplified herein by the inverter stage 52_E) and the reference voltage node 56. For instance, transistor 62 may have a source terminal coupled to the reference voltage node 56 and a drain terminal coupled to the output node of the ring oscillator 50. The bulk terminal of transistor 62 may be connected to the reference voltage node 56. The gate terminal of transistor 62 may be coupled to the output node of the inverter circuit 504 to receive the control signal StartP.

Figure 6:
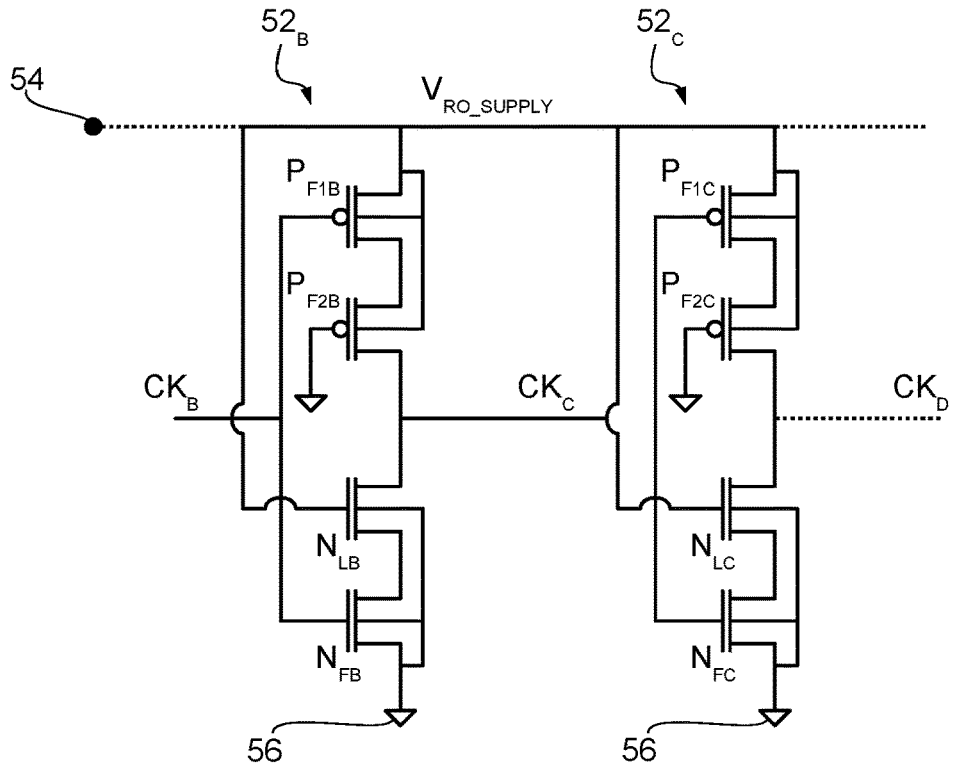
FIG. 6 is a circuit diagram exemplary of a portion of a ring oscillator according to one or more embodiments of the present description.
Figure 7:
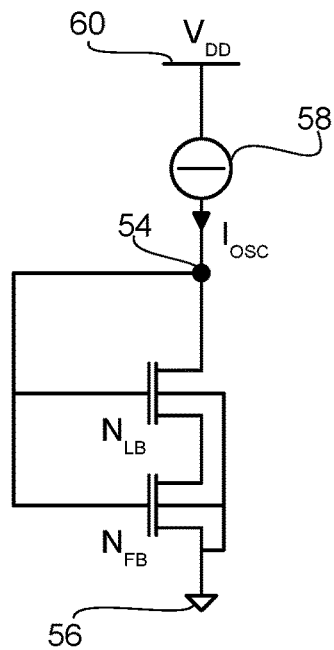
FIG. 7 is a circuit diagram exemplary of an equivalent circuit of the low-side portion of an inverter stage of a ring oscillator according to one or more embodiments of the present description, during a discharge phase of the oscillation period.

Operation of a ring oscillator 50 as exemplified in FIG. 5 may be further understood with reference to FIGS. 6 and 7. FIG. 6 is a circuit diagram exemplary of a portion of a ring oscillator 50, in particular exemplary of the inverter stages 52_B and 52_C. FIG. 7 is a circuit diagram exemplary of an equivalent representation of the low-side portion of the inverter stage 52_B during a discharge phase of the respective oscillation period.

As exemplified in FIG. 7, during oscillation of the ring oscillator 50, the gate terminals of the transistors $N_L$ and $N_F$ in the low-side portion of a certain inverter stage (e.g., the second inverter stage 52_B, purely by way of example) are biased at $V_{RO\_SUPPLY}$ during the respective discharge phase (i.e., when the high-side portion of the inverter is in a non-conductive state and the low-side portion of the inverter is in a conductive state), insofar as transistors NL are constantly biased at $V_{RO\_SUPPLY}$ and transistors NF receive a driving signal CK that switches between $V_{GND}$ (e.g., 0 V) and $V_{RO\_SUPPLY}$. Polarization of the series arrangement of transistors $N_L$ and $N_F$ is equivalent to a constant biasing at $I_{OSC}$ on an equivalent series transistor having length $L_{EQ}=L_L+L_S$. The equivalent transistor may be biased in null point at $I_{OSC}$, thereby providing temperature compensation of the oscillator supply voltage $V_{RO\_SUPPLY}$ at null point.

In one or more embodiments, the transistor $N_{FZ}$ driven by signal StartP may be turned off during oscillation of the ring oscillator 50 (e.g., when StartOsc=1 and StartP=0) and may be turned on while the ring oscillator 50 is inactive (e.g., when StartOsc=0 and StartP=1) in order to keep the oscillator supply voltage $V_{RO\_SUPPLY}$ at node 54 close to oscillation operating value. By having the oscillator supply voltage $V_{RO\_SUPPLY}$ biased very close to the oscillation operating voltage before starting the oscillator 50, the oscillations may rapidly reach a regime value upon activation of the ring oscillator 50. This may facilitate reducing or even avoiding a transient (out-of-specification) phase at the start of the ring oscillator 50.

In one or more embodiments, a high oscillation frequency (e.g., around 900 MHz) may be achieved resorting to a series arrangement of two n-channel MOS transistors in the low-side portion of the inverter stages 52. In particular, a MOS transistor with a long channel ($N_L$, having length $L_L$) does not switch and has a gate terminal constantly biased at $V_{RO\_SUPPLY}$, and a MOS transistor with a short channel ($N_F$, having length $L_S$) switches under the control of a respective control signal CK, providing a low loading for oscillations at high frequencies.

Additionally, unbalanced sizing of the high-side p-channel MOS transistors and the low-side n-channel MOS transistors (e.g., with the p-channel transistors being more conductive than the n-channel transistors) may result in fast rising edges and slow falling edges of the signals CK.

One or more embodiments may thus provide a clear design procedure for the design of a ring oscillator 50. In particular, the design procedure may set certain parameters of the ring oscillator 50 as target parameters. The target parameters may include a minimum system supply voltage $V_{DD,min}$, an oscillation frequency $F_{OSC}$, and/or a power consumption level (e.g., a value of the oscillator current $I_{OSC}$). Once set the parameters above, the design procedure may include selecting the size W/L (width to length ratio) of the equivalent n-channel MOS transistor for the low-side portions of the inverter stages in order to obtain a value of oscillator supply voltage $V_{RO\_SUPPLY}$ compatible with the minimum system supply voltage $V_{DD,min}$ at the null biasing point of the equivalent n-channel MOS transistor. For instance, $V_{RO\_SUPPLY}$ may be selected to be approximately equal to $V_{DD,min}-0.1V$ to maintain the current generator 58 in saturation. The width to length ratio W/L of the equivalent n-channel MOS transistor may be selected such that $V_{RO\_SUPPLY}$ is the gate voltage at null point with current $I_{OSC}$ flowing in the equivalent n-channel MOS transistor. At this stage, the length $L_S$ of switching transistor $N_F$ may be selected to be short enough to fulfill the capacitance target ($C_{OSC}$) to meet the desired oscillation frequency $F_{OSC}$. The length $L_L$ of non-switching transistor $N_L$ may be selected to be equal to the difference in lengths, as $L_L=L-L_S$. As indicated in the equation below, the capacitance of the n-channel MOS transistor $N_F$ may be selected to meet the desired oscillation frequency $F_{OSC}$:

$$T_{OSC} = \frac{1}{F_{OSC}} \sim N \cdot \frac{C_{OSC} \cdot V_{RO\_SUPPLY}}{I_{OSC}} = N \cdot \frac{(C_{PMOS} + C_{NMOS}) \cdot V_{RO\_SUPPLY}}{I_{OSC}}$$

Figure 8:
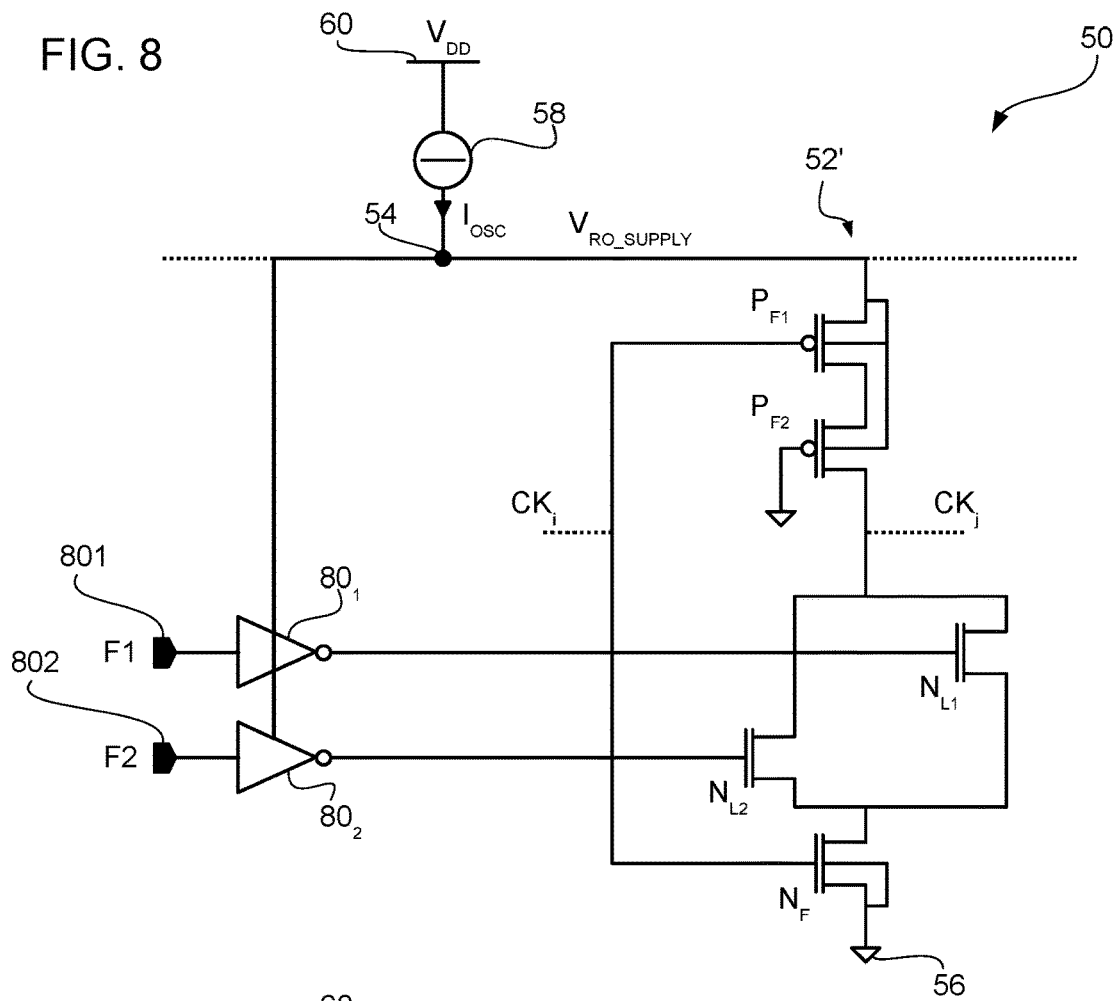
FIG. 8 is a circuit diagram exemplary of an inverter stage of a ring oscillator according to one or more embodiments of the present description.

In one or more embodiments as exemplified in FIG. 8, a ring oscillator 50 may be configured to provide operation at multiple (e.g., selectable) oscillation frequencies while preserving temperature compensation at any such frequency.

In particular, FIG. 8 is a circuit diagram exemplary of a single inverter stage 52' as possibly provided in a ring oscillator 50. The person skilled in the art will understand that a single inverter stage 52' is illustrated in FIG. 8 for the sake of ease of illustration only, and that a ring oscillator 50 may comprise a chain of inverter stages 52' as previously discussed with reference to FIG. 5. In one or more embodiments, the low-side portion of each inverter stage 52' may comprise two (or more) resistive n-channel MOS transistors $N_{L1}$, $N_{L2}$ arranged in parallel in the place of a single n-channel MOS transistor $N_L$. The transistors $N_{L1}$ and $N_{L2}$ may have the same width $W_N$ and different lengths $L_{L1}$ and $L_{L2}$, respectively.

The gate terminal of each of the transistors $N_{L1}$, $N_{L2}$ is configured to receive the voltage $V_{RO\_SUPPLY}$ via a respective selectively activatable buffer (e.g., inverter) circuit $80_1$, $80_2$. For instance, the gate terminal of transistor $N_{L1}$ may be coupled to the output node of an inverter $80_1$ arranged between nodes 54 and 56, which may receive a control signal F1 at a respective input node 801. The gate terminal of transistor $N_{L2}$ may be coupled to the output node of an inverter $80_2$ arranged between nodes 54 and 56, which may receive a control signal F2 at a respective input node 802. Therefore, if F1=1 and F2=0 the inverter stage 52' operates via the series arrangement of transistors $N_F$ and $N_{L2}$, and if F1=0 and F2=1 the inverter stage 52' operates via the series arrangement of transistors $N_F$ and $N_{L1}$. Since transistors Nu, $N_{L2}$ have different lengths and are designed to have null biasing point at different values of the current $I_{OSC}$, then $I_{OSC2} \neq I_{OSC1}$ and $F_{OSC2} \neq F_{OSC1}$.

Figure 9:
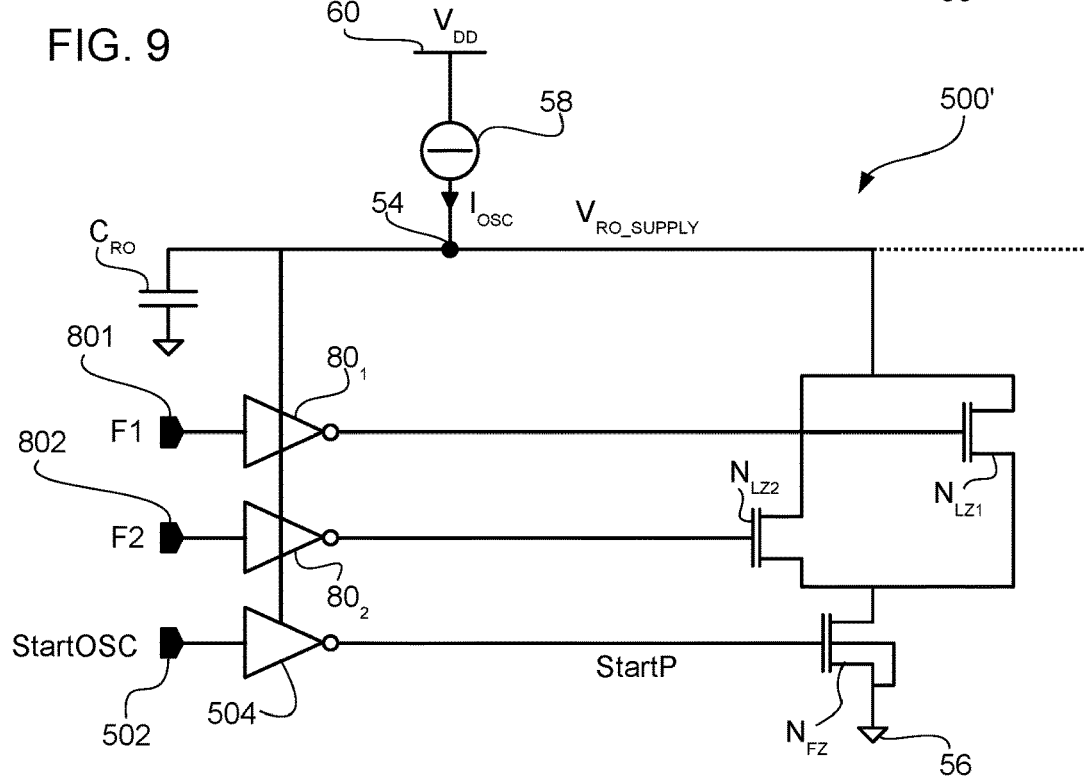
FIG. 9 is a circuit diagram exemplary of a biasing circuit of a ring oscillator according to one or more embodiments of the present description.

In one or more embodiments as exemplified with reference to FIG. 8, the biasing circuit may be modified accordingly, providing two (or more) resistive n-channel MOS transistors $N_{LZ1}$, $N_{LZ2}$ arranged in parallel in the place of a single n-channel MOS transistor $N_{LZ}$. FIG. 9 is a circuit diagram exemplary of such a modified biasing circuit 500'. The transistors $N_{LZ1}$ and $N_{LZ2}$ may have the same width $W_N$ and different lengths $L_{L1}$ and $L_{L2}$, respectively.

The gate terminal of each of the transistors $N_{LZ1}$, $N_{LZ2}$ is configured to receive the voltage $V_{RO\_SUPPLY}$ via the respective selectively activatable buffer (or inverter) circuit $80_1$, $80_2$. For instance, the gate terminal of transistor $NN_{LZ1}$ may be coupled to the output node of inverter $80_1$ and the gate terminal of transistor $N_{LZ2}$ may be coupled to the output node of inverter $80_2$.

The person skilled in the art will understand that either signal F1 or signal F2 may assume a high logic value (e.g., 1) according to the selected oscillation frequency. In one or more embodiments, more than two resistive n-channel MOS transistors may be provided in parallel, so that more than two selectable oscillation frequencies may be provided. Additionally or alternatively, the oscillation frequency may be selected by operating a combination of such MOS transistors (e.g., depending on the combinations of logic values of the control signals F1, F2, . . . ).

One or more embodiments may thus provide one or more of the following advantages:
- a well-defined design method to obtain a good trade-off between oscillation frequency $F_{OSC}$, power consumption, and minimum system supply voltage $V_{DD,min}$;
- temperature compensation obtained by null point biasing of the low-side n-channel transistors;
- possibility of tuning the oscillator circuit at more than one frequency while maintaining a temperature compensation; and
- fast start/stop operation of the oscillator circuit without using additional circuitry (e.g., without using an additional oscillator) insofar as the oscillation frequency may be at regime when the oscillator starts, thereby avoiding the risk of out-of-spec frequency for logic blocks that receive the output signal from the oscillator circuit.

Without prejudice to the underlying principles, the details and embodiments may vary, even significantly, with respect to what has been described by way of example only, without departing from the extent of protection.

The extent of protection is determined by the annexed claims.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A ring oscillator circuit comprising:
   a chain of cascade-coupled inverter stages coupled between an oscillator supply voltage node and a reference voltage node, the oscillator supply voltage node configured to provide an oscillator supply voltage;
   a current generator circuit coupled between the oscillator supply voltage node and a system supply voltage node configured to provide a system supply voltage, the current generator circuit being configured to inject a current into the oscillator supply voltage node,
   wherein each inverter stage comprises a first low-side transistor and a second low-side transistor coupled in series between the reference voltage node and an output node of the respective inverter stage, and a first high-side transistor coupled between the oscillator supply voltage node and the output node of the respective inverter stage,
   wherein the first low-side transistor and the first high-side transistor of each inverter stage have respective control terminals coupled to an input node of the respective inverter stage to receive therefrom a respective inverter control signal, and
   wherein the second low-side transistor of each inverter stage has a control terminal coupled to the oscillator supply voltage node to receive the oscillator supply voltage; and
   a biasing circuit comprising a first bias control transistor and a second bias control transistor coupled in series between the reference voltage node and the oscillator supply voltage node,
   wherein the first bias control transistor has a control terminal configured to receive an oscillator control signal indicative of whether the ring oscillator circuit is in an active operation state or in an inactive operation state,
   wherein the second bias control transistor has a control terminal coupled to the oscillator supply voltage node to receive the oscillator supply voltage, and
   wherein the first bias control transistor is configured to selectively couple the reference voltage node and the oscillator supply voltage node in response to the oscillator control signal being indicative that the ring oscillator circuit is in an inactive operation state.

2. The ring oscillator circuit of claim 1, wherein a conductivity of the first low-side transistors, when operating in a conductive state is higher than a conductivity of the respective second low-side transistors, when operating in a conductive state.

3. The ring oscillator circuit of claim 1, wherein a conductive channel of the first low-side transistors is shorter than a conductive channel of the respective second low-side transistors.

4. The ring oscillator circuit of claim 1,
wherein each inverter stage comprises a second high-side transistor coupled in series to the first high-side transistor between the oscillator supply voltage node and the output node of the respective inverter stage, and
wherein the second high-side transistor has a control terminal coupled to the reference voltage node.

5. The ring oscillator circuit of claim 4, wherein the second high-side transistor of a last inverter stage in a chain of cascade-coupled inverter stages has a control terminal configured to receive the oscillator control signal.

6. The ring oscillator circuit of claim 4, wherein a conductivity of the first high-side transistors, when operating in a conductive state, is higher than a conductivity of the respective first low-side transistors, when operating in a conductive state, and higher than a conductivity of the respective second low-side transistors, when operating in a conductive state.

7. The ring oscillator circuit of claim 4, wherein a conductivity of the second high-side transistors, when operating in a conductive state, is higher than a conductivity of the respective first low-side transistors, when operating in a conductive state, and higher than a conductivity of the respective second low-side transistors, when operating in a conductive state.

8. The ring oscillator circuit of claim 4, wherein a conductivity of the first high-side transistors and the second high-side transistors, when operating in a conductive state, is higher than a conductivity of the respective first low-side transistors, when operating in a conductive state and higher than a conductivity of the respective second low-side transistors, when operating in a conductive state.

9. The ring oscillator circuit of claim 4, wherein a conductive channel of the first high-side transistors is shorter than a conductive channel of the respective first low-side transistors and shorter than a conductive channel of the respective second low-side transistors.

10. The ring oscillator circuit of claim 4, wherein a conductive channel of the second high-side transistors is shorter than a conductive channel of the respective first low-side transistors and shorter than a conductive channel of the respective second low-side transistors.

11. The ring oscillator circuit of claim 4, wherein a conductive channel of the first high-side transistors and the second high-side transistors is shorter than a conductive channel of the respective first low-side transistors and shorter than a conductive channel of the respective second low-side transistors.

12. The ring oscillator circuit of claim 1, further comprising an output control transistor coupled between an output node of the ring oscillator circuit and the reference voltage node.

13. The ring oscillator circuit of claim 12,
wherein the output control transistor has a control terminal configured to receive the oscillator control signal, and
wherein the output control transistor is configured to selectively couple the reference voltage node and the output node of the ring oscillator circuit in response to the oscillator control signal being indicative that the ring oscillator circuit is in an inactive operation state.

14. The ring oscillator circuit of claim 1, wherein each inverter stage comprises a plurality of the second low-side transistors arranged in parallel, wherein the second low-side transistors arranged in parallel have different conductivity values, when operating in a conductive state, and wherein the second low-side transistors arranged in parallel have respective control terminals selectively couplable to the oscillator supply voltage node as a function of respective frequency selection signals.

15. The ring oscillator circuit of claim 14, wherein the biasing circuit includes a plurality of the second bias control transistors arranged in parallel, wherein the second bias control transistors arranged in parallel have different conductivity values, when operating in a conductive state, and wherein the second bias control transistors arranged in parallel have respective control terminals selectively couplable to the oscillator supply voltage node as a function of the respective frequency selection signals.

16. The ring oscillator circuit of claim 1, wherein the biasing circuit includes a plurality of the second bias control transistors arranged in parallel, wherein the second bias control transistors arranged in parallel have different conductivity values, when operating in a conductive state, and wherein the second bias control transistors arranged in parallel have respective control terminals selectively couplable to the oscillator supply voltage node as a function of the respective frequency selection signals.

* * * * *